United States Patent
Schwarzer

(10) Patent No.: US 7,839,185 B2
(45) Date of Patent: Nov. 23, 2010

(54) METHOD AND CIRCUIT ARRANGEMENT CONFIGURED FOR DRIVING A FIELD-EFFECT-CONTROLLED TRANSISTOR

(75) Inventor: Ulrich Michael Georg Schwarzer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/022,587

(22) Filed: Jan. 30, 2008

(65) Prior Publication Data

US 2008/0204087 A1   Aug. 28, 2008

(30) Foreign Application Priority Data

Feb. 28, 2007   (DE) .................. 10 2007 009 734

(51) Int. Cl.
*H03B 1/00*   (2006.01)
*H03K 3/00*   (2006.01)

(52) U.S. Cl. .................. 327/109; 327/108; 327/427; 326/82; 326/83

(58) Field of Classification Search ......... 327/108–112, 327/379, 389, 391, 419, 427–437; 326/22–27, 326/82, 83, 86, 87
See application file for complete search history.

(56) References Cited

U.S. PATENT DOCUMENTS

| | | | | |
|---|---|---|---|---|
| 5,390,070 A | * | 2/1995 | Niedermeier | 361/152 |
| 5,625,645 A | * | 4/1997 | Greier et al. | 375/276 |
| 5,929,665 A | * | 7/1999 | Ichikawa et al. | 327/109 |
| 6,333,665 B1 | * | 12/2001 | Ichikawa | 327/434 |
| 2002/0171455 A1 | * | 11/2002 | Tsuchida et al. | 327/108 |
| 2004/0135528 A1 | * | 7/2004 | Yasohara et al. | 318/254 |
| 2006/0109034 A1 | * | 5/2006 | Okitsu | 327/108 |

OTHER PUBLICATIONS

Wikipidia—Inductor\ http://en.wikipedia.org/wiki/Inductor.*
Musumeci et al. "Switching-Behavior Improvement of Insulated Gate-Controlled Devices", IEEE Transactions on Power Electronics, vol. 12, No. 4, Jul. 1997 (pp. 645-653).

* cited by examiner

*Primary Examiner*—Lincoln Donovan
*Assistant Examiner*—Brandon S Cole
(74) *Attorney, Agent, or Firm*—Dicke, Billig & Czaja, PLLC

(57) ABSTRACT

A method and circuit arrangement including driving a field effect controlled transistor. One embodiment provides a first load terminal, a second load terminal and a control terminal. The control terminal is driven, at least during a Miller plateau phase of the transistor, with a pulse-width-modulated control signal whose period duration is shorter than the duration of the Miller plateau phase.

20 Claims, 5 Drawing Sheets

METHOD AND CIRCUIT ARRANGEMENT CONFIGURED FOR DRIVING A FIELD-EFFECT-CONTROLLED TRANSISTOR

CROSS-REFERENCE TO RELATED APPLICATIONS

This Utility patent application claims priority to German Patent Application No. DE 10 2007 009 734.6-42 filed on Feb. 28, 2007, which is incorporated herein by reference.

BACKGROUND

The invention relates to a method and a circuit arrangement configured for driving a field-effect-controlled transistor whose switching behavior is intended to be specifically influenced.

The transient switching behavior of a field-effect-controlled transistor (for example MOSFET, IGBT etc.) is influenced by the temporally dependent amount of charge in the gate of the transistor. The temporal profile of this amount of charge is determined by the temporally dependent injection of the gate current. The transient profiles of the load current and the voltage across the load path and thus also the turn-on and turn-off losses can be influenced by prescribing a particular gate current when turning the transistor on and off.

In the case of known driver circuits for driving the gate, the current which charges the gate-source capacitance of the transistor to be controlled is usually determined in a very simple manner by a gate resistor which connects the driver circuit and the gate connection of the transistor. The gate current is thus dependent on the voltage difference between the gate voltage and the control voltage provided by the driver circuit and on the gate resistance. However, more complex influencing which could determine the exact switching behavior of the transistor is thus not possible, and there is a general need for a method for driving a field-effect-controlled transistor in order to influence the switching operation in a flexible manner.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
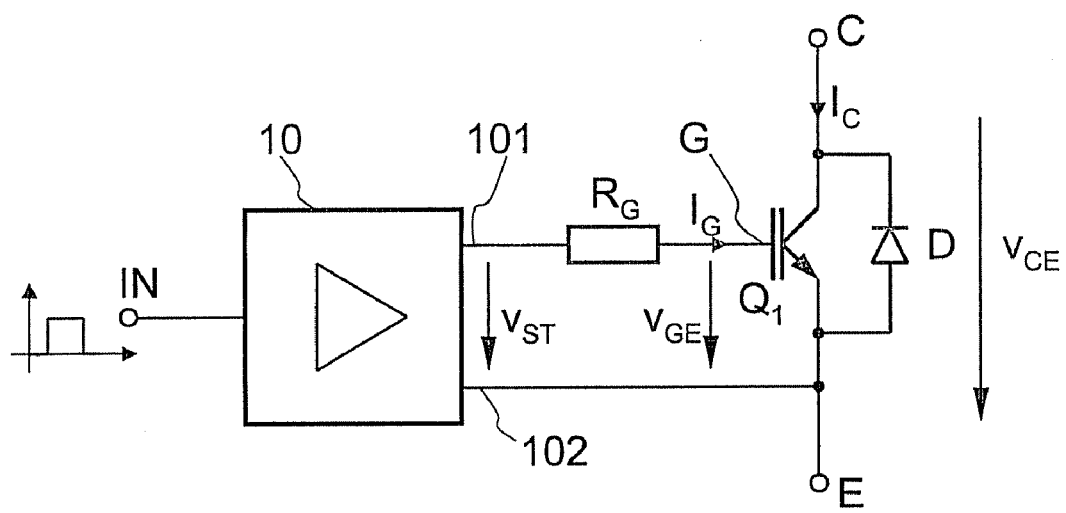
FIG. 1 illustrates a circuit arrangement having a field-effect-controlled transistor and a driver circuit.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

According to one embodiment, the gate of the field-effect-controlled transistor is driven with a pulse-width-modulated (PWM) signal. One factor in this case is that the period duration of the PWM signal is shorter, in one embodiment considerably shorter, than the duration of the Miller plateau phase of the transistor being driven. This makes it possible to considerably reduce the gate resistance in comparison with the prior art described above or to even omit it, and no controlled current sources are required either. The average gate current is primarily determined by the mean value (i.e. the duty ratio or duty cycle) of the PWM signal. It goes without saying that the frequency of the PWM signal need not be constant during the entire turn-on or turn-off operation; rather, the ability to vary the frequency of the PWM signal can be used to specifically influence the switching operation. The duration of the Miller plateau phase is determined by the value of the Miller capacitance of the transistor and by the charging current of the Miller capacitance. Specifically controlling the charging operation of the Miller capacitance makes it possible to influence the steepness of the slope of the switching operations (also known as "edge shaping") and the switching losses. It is possible to influence the switching operation on the basis of further variables, for example the load current or the voltage across the load path, or else on the basis of the gate voltage.

For example, the driver circuit may be connected to one or more feedback networks which make it possible to feed the load current through the transistor, the voltage across the load path of the transistor, or else the gate voltage back to the PWM signal. In these cases, the transistor is driven on the basis of the load current, the voltage across the load path, the gate voltage or a combination of the variables. To this end, the circuit arrangement may include a driver circuit having a PWM modulator which is designed to vary the duty ratio of the pulse-width-modulated control signal in accordance with the signals provided by the feedback networks.

In one example, the operation of driving the transistor using a PWM signal is carried out only during the Miller plateau phase. The point at which the Miller plateau phase is reached can be determined either by measurement or by assuming a particular period of time which depends on the transistor being used.

One advantage of the method described here and of the circuit arrangement described here is the ability to actively control the gate in a very simple and cost-effective manner. Known driver circuits can be modified only slightly for this purpose (for example extended with a PWM modulator).

In addition, the method can be used not only during the turn-on operation but also during the turn-off operation, in one embodiment in the event of a short circuit or overcurrent.

FIG. 1 illustrates a resistance-controlled driver circuit. A field-effect-controlled transistor, specifically a power IGBT $Q_1$ having a collector terminal C, an emitter terminal E and a gate terminal G, is driven with the aid of a driver circuit 10. A MOSFET, for example, could also be used instead of an IGBT. For this purpose, a first output 101 of the driver circuit 10 is connected to the gate terminal G of the transistor $Q_1$ via a gate resistor $R_G$. The driver circuit 10 provides a control voltage $V_{ST}$, which is based on the emitter terminal E of the transistor $Q_1$, at this first output 101, with the result that a gate voltage $V_{GE}$ is established between the gate connection G and the emitter terminal E of the transistor $Q_1$. For this purpose, the emitter terminal E is connected to a second output 102 of the driver circuit 10. The difference between the control voltage $V_{ST}$ and the gate voltage $V_{GE}$ corresponds to the voltage drop produced across the gate resistor $R_G$ by the gate current $I_G$. The driver circuit 10 also has an input IN which is supplied with an input signal whose logic level determines the switching state of the transistor $Q_1$. The diode illustrated in FIG. 1 is present in most field-effect-controlled transistors on account of the technology but does not play a role in the further considerations.

Figure 2:
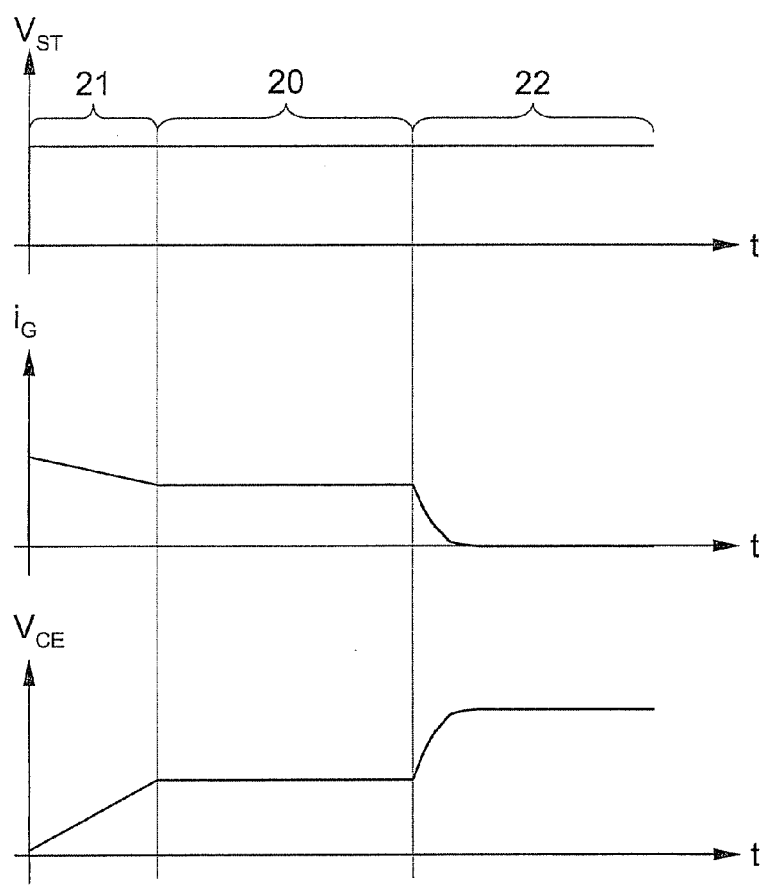
FIG. 2 illustrates the typical signal profiles for the control voltage, the gate current and the gate voltage at the transistor in a circuit arrangement according to FIG. 1.

The method of operation of the circuit illustrated in FIG. 1 becomes clear when the voltage profiles in FIG. 2 are considered. These voltage profiles illustrate a turn-on operation in the case of a field-effect-controlled transistor connected in accordance with FIG. 1. An input signal having a particular logic level at the input IN of the driver circuit 10 initiates the turn-on operation. At its first output 101, the driver circuit 10 switches the control voltage $V_{ST}$ from a low level to a high level in comparison with the output 102. If the gate-emitter capacitance has previously been discharged, the gate voltage $V_{GE}$ of the transistor $Q_1$ is first of all zero and a gate current $I_G$ which depends on the gate resistance $R_G$ flows in this case. As a result, the gate of the transistor $Q_1$ is charged and the gate voltage $V_{GE}$ begins to rise. An initially falling profile of the gate current $I_G$ and a rising profile of the gate voltage $V_{GE}$ consequently result. In this phase of the turn-on operation, which is referred to as the starting phase 21, the voltage and current profiles at the gate of the transistor $Q_1$ correspond to the capacitor charging operation in the case of a simple RC element.

However, after a certain amount of time, the gate voltage $V_{GE}$ no longer continues to rise, and the gate current $I_G$ remains substantially constant. This phase is referred to as the Miller plateau phase 20. This effect is caused by the Miller capacitance (also the gate-collector capacitance) which is charged when the transistor $Q_1$ is off and must be discharged during the turn-on operation. This discharging operation takes place during the Miller plateau phase 20.

The end phase 22 of the turn-on operation then follows, in which phase the gate-emitter capacitance of the transistor is charged further, the gate voltage $V_{GE}$ increases again and, as a result, the gate current $I_G$ continues to fall until the gate-emitter capacitance of the transistor $Q_1$ has been fully charged and the transistor has been turned on completely.

The duration of the turn-on operation depends, on the one hand, on the gate resistance $R_G$ and, on the other hand, on the Miller capacitance of the transistor $Q_1$. Both variables considerably influence the duration of the Miller plateau phase 20 which constitutes a large part of the turn-on time. The Miller capacitance is a variable which depends on the component and, in the case of a drive method according to the prior art just described, it is consequently possible to influence the switching operation only by using the gate resistance $R_G$. For this purpose, the gate resistance could be replaced with a controlled current source. However, it is obvious that this possibility for influencing is very complicated and inflexible.

Figure 3:
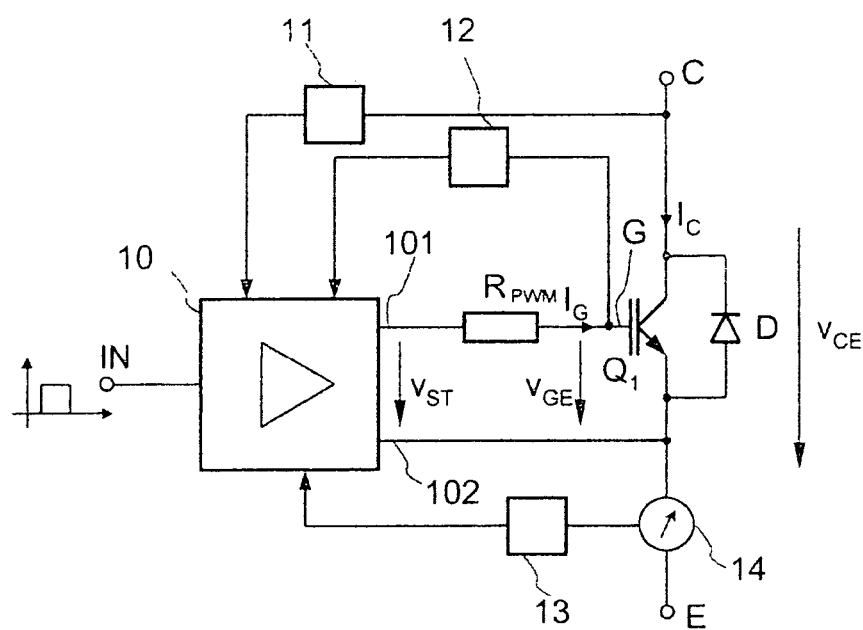
FIG. 3 illustrates a circuit arrangement having a field-effect-controlled transistor, a driver circuit and feedback paths which feed the voltage across the load path, the load current and/or the gate voltage back to the driver circuit.

FIG. 3 illustrates one example of a circuit arrangement for carrying out a method for driving a field-effect-controlled transistor $Q_1$, an IGBT in the case illustrated. The transistor $Q_1$ includes a collector terminal C, an emitter terminal E and a gate connection G. The gate connection G is connected to a first output 101 of a driver circuit 10 via a gate resistor $R_{PWM}$. Furthermore, the emitter terminal E is connected to a second output 102 of the driver circuit 10. The driver circuit 10 additionally includes an input IN. An input signal which is supplied to this input IN determines the switching state of the transistor $Q_1$.

The circuit arrangement in FIG. 3 primarily differs from that in FIG. 1 by virtue of the feedback networks 11, 12 and 13. The voltage $V_{CE}$ across the load path (collector-emitter path) of the transistor is fed back to the driver circuit via the feedback network 11, the gate-emitter voltage $V_{GE}$ is fed back via the feedback network 12 and the load current $I_C$ is fed back via the feedback network 13. A current measuring circuit 14 is provided for the purpose of feeding back the load current $i_C$. However, the load current may also be determined indirectly by measuring the gate-emitter voltage $V_{GE}$ since the load current depends on the gate-emitter voltage $V_{GE}$. The driver circuit 10 is designed to generate a PWM signal, which depends on the signals which have been fed back, as a control signal $V_{ST}$.

Figure 4:
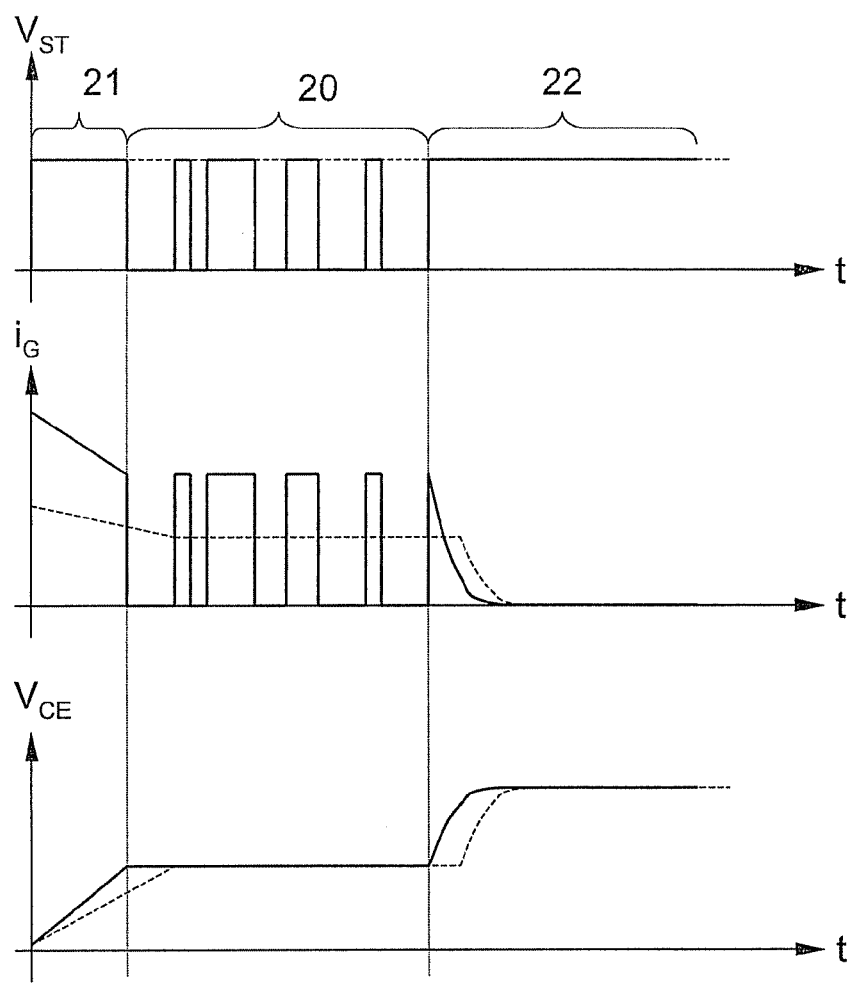
FIG. 4 illustrates the typical signal profiles for the control voltage, the gate current and the gate voltage when the method is used to control the gate.

FIG. 4 illustrates the resultant signal profiles for the control voltage $V_{ST}$, the gate current $I_G$ and the gate voltage $V_{GE}$ when a method according to one embodiment is used. The signal profiles from FIG. 2 are illustrated once again here using dashed lines for the sake of better comparison with the prior art. Although FIG. 4 illustrates the turn-on operation, the method can also be applied to the turn-off operation in a corresponding manner.

The turn-on operation can again be subdivided into a starting phase 21, a Miller plateau phase 20 and an end phase 22. Initiated by an input signal at the input IN of the driver circuit 10, the control voltage $V_{ST}$ is first of all set from a low level to a high level in the starting phase 21. The resultant gate current profile $I_G$ is similar to that illustrated in FIG. 2. However, a higher gate current $I_G$ is established on account of the lower value for the gate resistance $R_{PWM}$. The resultant rise in the gate voltage $V_{GE}$ is accordingly also steeper and the Miller plateau 20 is reached earlier than in the method described in FIG. 2.

In the subsequent Miller plateau phase 20, the gate is driven with the aid of a PWM signal as the control voltage $V_{ST}$. The beginning of the Miller plateau phase is detected, for example, by the gate-emitter voltage $V_{GE}$ exceeding a particular threshold value which depends on the threshold voltage of the transistor. The end of the Miller plateau phase can be assumed after a certain period of time has elapsed. In one embodiment, it is also possible for two (component-dependent) threshold values to be defined and for the Miller plateau phase to be assumed as long as the gate-emitter voltage $V_{GE}$ is within the interval defined by these threshold values.

FIG. 4 likewise diagrammatically illustrates one possible form of the control signal $V_{ST}$. The duty ratio of the PWM signal can be varied on the basis of the signals fed back by the feedback paths 11, 12 and 13. The end of the Miller plateau phase is again indicated by a further rise in the gate voltage and by a fall in the gate current. In this end phase 22, PWM driving can be dispensed with again and a constant control voltage $V_{ST}$ is again produced between the outputs 101 and 102 of the driver circuit.

A PWM control voltage during the Miller plateau phase influences the switching behavior of the transistor. It is possible to change over to a constant drive voltage before and after the phase. Another possibility is to operate the PWM driving before and/or after with a duty ratio close to 1 in order to obtain the constant drive voltage.

Figure 5:
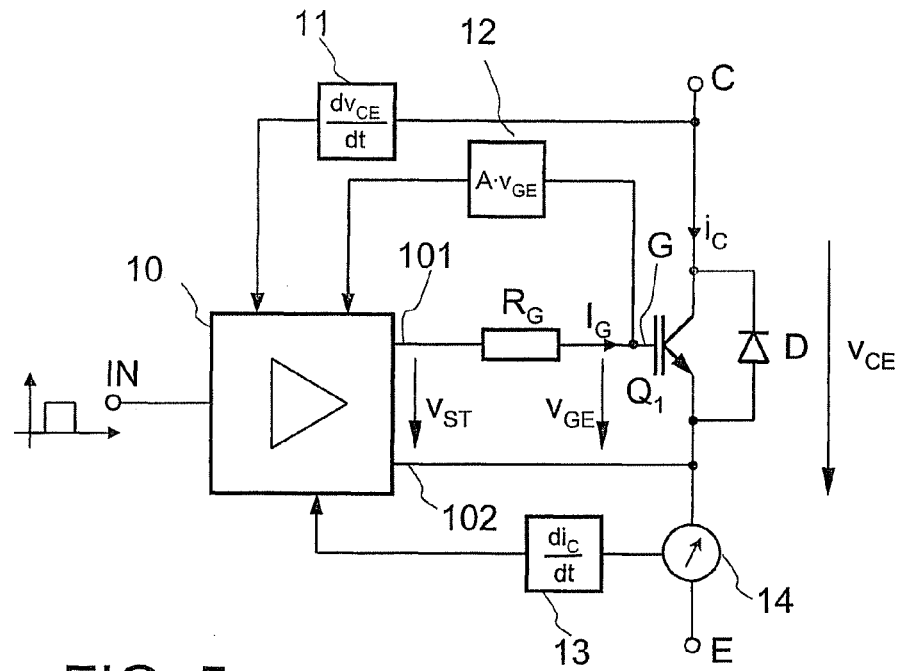
FIG. 5 illustrates the circuit arrangement from FIG. 3 in which the feedback paths are specified in more detail.

FIG. 5 illustrates the circuit arrangement from FIG. 3 in more detail, the feedback networks 11, 12 and 13 being specified in more detail, in one embodiment. The feedback networks 11 and 13 may accordingly be differentiating elements, with the result that the feedback network 11 feeds the temporal derivative $dV_{CE}/dt$, that is to say the rise in the collector-emitter voltage $V_{CE}$, back to the driver circuit 10. The feedback network 13 accordingly feeds back the derivative, that is to say the rise $di_C/dt$ in the load current $i_C$. The feedback element 12 may be, for example, in the form of a simple amplifier with a gain factor A, with the result that a variable which is proportional to the gate-emitter voltage $V_{GE}$ is fed back to the driver circuit. In one embodiment, as already indicated above, the load current $i_C$ could be determined from the gate-emitter voltage $V_{GE}$ in the feedback network 12.

Figure 6:
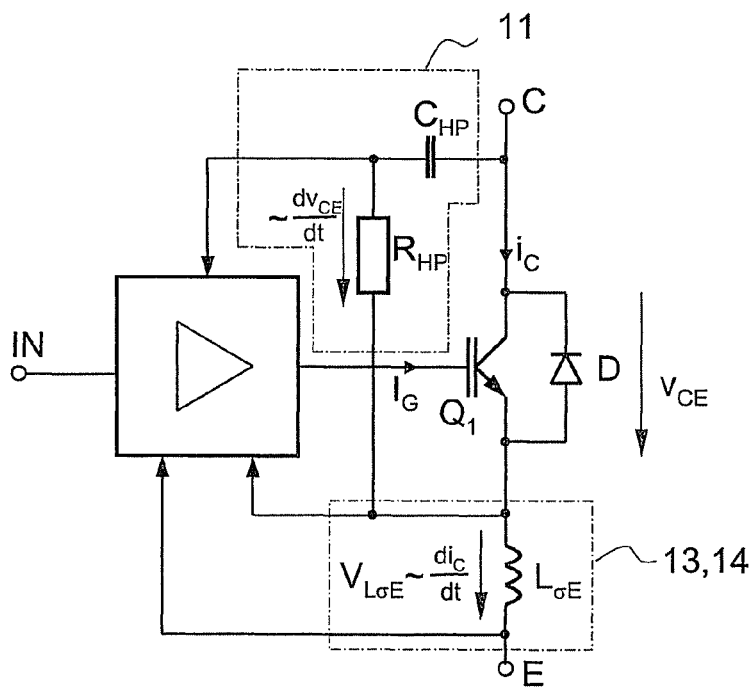
FIG. 6 illustrates the circuit arrangement from FIGS. 3 and 5 in more detail.

FIG. 6 illustrates the circuit arrangement from FIG. 3 and FIG. 5 in more detail, possible implementations of the feedback networks 11, 12 and 13 being illustrated in more detail. The functionality of the current measuring circuit 14 and of the feedback network 13 is achieved by feeding back a voltage $V_{LoE}$ which is dropped across a stray inductance $L_{oE}$. This stray inductance $L_{oE}$ may be formed, for example, by a bonding wire which connects the emitter of the transistor $Q_1$ to the emitter terminal E. The potential which is directly applied to the emitter and the potential of the emitter terminal E are thus fed back to the driver circuit. According to the law of induction, a voltage is induced in the stray inductance, the voltage corresponding to the product of the inductance and the rate of change $di_C/dt$ of the current $i_C$ flowing through the stray inductance. The driver circuit receives the necessary information via the feedback voltage $V_{LoE}$. It is not necessary to explicitly measure the current in such an implementation.

As a result of the fact that the potential which is directly applied to the emitter of the transistor $Q_1$ is fed back, the feedback network 12 is also automatically implemented since the gate-emitter voltage $V_{GE}$ can thus also be determined, in the driver circuit, as the difference between the emitter potential which has been fed back and the gate potential.

The feedback network 11 is implemented, for example, with the aid of the passive high-pass filter which is formed by the capacitor $C_{HP}$ and the resistor $R_{HP}$ and is dimensioned as a differentiator. In this case, the capacitor $C_{HP}$ is connected between the driver circuit 10 and the collector of the transistor $Q_1$. The capacitor $C_{HP}$ and the resistor $R_{HP}$ are in a series circuit in parallel with the load path (collector-emitter) of the transistor $Q_1$. The high-pass filter has a range in which it exhibits a differentiating transfer response and a range in which it exhibits a proportional transfer response. The dimensions of the capacitor $C_{HP}$ and of the resistor $R_{HP}$ must be selected in such a manner that the high-pass filter operates as a differentiator.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a circuit including driving a field effect transistor comprising:
   providing a first load terminal, a second load terminal, and a control terminal; and
   driving the control terminal, at least during a Miller plateau phase of the transistor, with a pulse-width-modulated control signal whose period duration is shorter than the duration of the Miller plateau phase.

2. The method of claim 1, comprising wherein the duty cycle of the pulse-width-modulated control signal is adjustable.

3. The method of claim 2, comprising wherein the duty cycle of the pulse-width-modulated control signal depends on the voltage between the two load terminals.

4. The method of claim 2, comprising wherein the duty cycle of the pulse-width-modulated control signal depends on the load current through the transistor.

5. The method of claim 2, comprising wherein the duty ratio of the pulse-width-modulated control signal depends on the voltage between the control terminal and the second load terminal.

6. The method of claim 4, comprising determining the load current indirectly by measuring the voltage between the control terminal and one of the two load terminals.

7. The method of claim 1, comprising driving the control terminal of the transistor with the pulse-width-modulated control signal only during the Miller plateau phase of the transistor.

8. A circuit arrangement including a circuit for driving a field effect transistor comprising:
   a first load terminal;
   a second load terminal;
   a control terminal and
   a driver circuit comprising a pulse width modulator that provides a pulse-width-modulated control signal for driving the field effect transistor between a first output connected to the control terminal and a second output connected to the second load terminal, the period duration of the pulse-width-modulated control signal being shorter than the duration of a Miller plateau phase of the field effect transistor.

9. The circuit arrangement of claim 8, comprising wherein the duty cycle of the pulse-width-modulated control signal is adjustable.

10. The circuit arrangement of claim 9, comprising wherein a feedback network is connected to the driver circuit and to at least one of the load terminals, the feedback network providing the driver circuit with a signal depending on the voltage between the two load terminals.

11. The circuit arrangement of claim 10, comprising wherein the driver circuit is configured to adjust the duty cycle of the pulse-width-modulated control signal in accordance with the signal provided by the feedback network.

12. The circuit arrangement of claim 10, comprising wherein the feedback network comprises a differentiating element.

13. The circuit arrangement of claim 12, comprising wherein the differentiating element is formed by a passive high-pass filter that is dimensioned in such that it operates as a differentiator.

14. The circuit arrangement of claim 12, comprising wherein the differentiating element is formed by a stray inductance.

15. The circuit arrangement of claim 9, comprising wherein a feedback network is connected to the driver circuit and to the control terminal, the feedback network providing the driver circuit with a signal depending on the voltage between the control terminal and the second load terminal.

16. The circuit arrangement of claim 15, wherein the feedback network comprises an amplifier.

17. The circuit arrangement of claim 13, wherein the passive high-pass filter is comprises a resistor and a capacitor.

18. The circuit arrangement of claim 9, comprising wherein a feedback network is connected to the driver circuit and to one of the two load terminals, the feedback network providing the driver circuit with a signal depending on the load current through the transistor.

19. An integrated circuit comprising:
a field effect transistor having a Miller plateau phase; and
a driver circuit configured to provide a pulse width modulated control signal for driving the field effect transistor between a first output and a second output, having a period duration shorter than a duration of the Miller plateau phase.

20. The integrated circuit of claim 19, comprising:
a feedback network configured to provide the driver circuit with a signal depending on a load voltage.

* * * * *